(12) United States Patent
Uher

(10) Patent No.: US 9,059,682 B2
(45) Date of Patent: Jun. 16, 2015

(54) ORTHOMODE JUNCTION ASSEMBLY WITH ASSOCIATED FILTERS FOR USE IN AN ANTENNA FEED SYSTEM

(71) Applicant: Macdonald, Dettwiler and Associates Corporation, Ste-Anne-de-Bellevue (CA)

(72) Inventor: Jaroslaw Uher, Pointe-Claire (CA)

(73) Assignee: MACDONALD, DETTWILWE AND ASSOCIATES CORPORATION, Ste-Anne-de-Bellevue, Quebec (CA)

(*) Notice: Subject to any disclaimer, the term of this patent is extended or adjusted under 35 U.S.C. 154(b) by 42 days.

(21) Appl. No.: 13/974,640

(22) Filed: Aug. 23, 2013

(65) Prior Publication Data

US 2013/0342282 A1  Dec. 26, 2013

Related U.S. Application Data

(63) Continuation-in-part of application No. 12/458,490, filed on Jul. 14, 2009, now abandoned.

(60) Provisional application No. 61/129,711, filed on Jul. 14, 2008.

(51) Int. Cl.
  *H03H 7/46* (2006.01)
  *H01P 1/161* (2006.01)
  *H01P 1/213* (2006.01)

(52) U.S. Cl.
  CPC ............... *H03H 7/461* (2013.01); *H01P 1/161* (2013.01); *H01P 1/2131* (2013.01)

(58) Field of Classification Search
  CPC ..... H01P 1/161; H01P 1/2131; H01P 1/2138; H03H 7/461
  USPC .................. 333/117, 121, 126, 132, 135, 137; 342/153; 343/756
  See application file for complete search history.

(56) References Cited

U.S. PATENT DOCUMENTS

| | | | |
|---|---|---|---|
| 7,218,801 B2* | 5/2007 | Chambelin et al. | 385/11 |
| 8,878,629 B2* | 11/2014 | Gehring et al. | 333/135 |
| 2001/0033208 A1* | 10/2001 | Moheb | 333/135 |
| 2004/0140864 A1* | 7/2004 | Chen et al. | 333/126 |
| 2006/0028296 A1* | 2/2006 | Yun et al. | 333/126 |
| 2010/0007432 A1* | 1/2010 | Uher | 333/132 |

* cited by examiner

*Primary Examiner* — Patrick O'Neill
(74) *Attorney, Agent, or Firm* — Equinox IP; Franz Bonsang

(57) ABSTRACT

An advanced reverse orthomode junction feed assembly with associated filters for use in an antenna feed system for transmitting a first low frequency (LF) electromagnetic signal and receiving a second high frequency (HF) electromagnetic signal. The assembly includes, in a preferred square waveguide topology, an orthomode junction with an antenna port for connecting to a choking iris matching section and an antenna feed, an opposed generally coaxial first signal port to transmit the LF signal, and a generally perpendicular second signal port, located there between, to receive the HF signal. A first signal channel having fully asymmetric on-axis second signal reject filters connects to the first port; and a second signal channel having cross-axis first signal reject filters with multi-cavity HF path matching assembly connects to the second port. The use of a magic-tee as a combiner for the receive signal provides tracking capability to the antenna feed system.

10 Claims, 4 Drawing Sheets

ORTHOMODE JUNCTION ASSEMBLY WITH ASSOCIATED FILTERS FOR USE IN AN ANTENNA FEED SYSTEM

CROSS REFERENCE TO RELATED APPLICATIONS

The present application is a Continuation-In-Part of, now abandoned, U.S. patent application Ser. No. 12/458,490, filed on Jul. 14, 2009 and published on Jan. 14, 0210 under Publication No. US 2010/0007432 A1, which claimed benefit of priority of U.S. Provisional Application for Patent Ser. No. 61/129,711 filed on Jul. 14, 2008, both of which being incorporated herein by reference.

FIELD OF THE INVENTION

The present invention relates to the field of antennas, and more particularly to an orthomode junction feed assembly with associated filters for use in an antenna feed system based on reversed orthomode junction topology.

BACKGROUND OF THE INVENTION

The current turnstile junction industry standard is a topology in which the four (4) branching waveguides are assigned to the lower frequency feed section (typically transmit (Tx) signal) and the high frequency feed section is aligned with the feed horn axis. Therefore, four (4) receive (Rx) band reject filters or other types of filters must be used to separate the Tx and Rx frequency bands.

Such antenna feed systems tend to be large in volume and mass, especially at lower frequencies such as at C-band (between about 3.4 GHz and 6.8 GHz). The filters used in the Tx waveguides tend to have sections small in size thus limiting both peak and average power handling capabilities.

Modern satellite systems typically employ antennas compatible with advanced multi-channel, multi-frequency payloads. The key component of such satellite antenna is the feed system whose design is essential in achieving required payload functionality. There is a multitude of waveguide components that are typically used in the design of an antenna feed system. These include filters, polarizers, orthomode transducers, diplexers and power combiners or splitters. Depending on the components selection and the quality of their design a particular level of the feed RF (Radio Frequency) performance can be achieved. For wide-band multi-frequency, dual linear or dual circular polarization, typically orthomode junctions (OMJ) based feeds are employed.

An OMJ can be constructed in two design options. In the more common version the axial section of the feed (sharing the symmetry axis with the feed horn) includes the high frequency feed section, typically operating in the receive frequency band. The less common OMJ option features a reversed topology where the axial section of the feed is assigned to the lower frequency band (typically operating in the transmit frequency band).

The isolation between transmitting and receiving frequency bands is accomplished by connecting filters in the high and low frequency signal paths. One of the most critical performance requirements at the feed component level is the signal return loss (too much return loss leads to too much power dissipated into the different antenna components, and increased unacceptable operating temperatures, especially at high Tx power signals, such as 100 Watts and more). In antenna systems operating in dual circular polarization the current requirement for Tx-Tx or Rx-Rx ports isolation is 25-30 dB (decibels). Since in the circularly polarized feed the port isolation is driven by the cascaded return loss of the feed chain components, the task of designing a feed arrangement that can meet such most stringent return loss requirements has become a critical issue in space antenna engineering.

In U.S. Patent Application Publication No. 2004/0140864A1 to Chen et al., published on Jul. 22, 2004, a prior art feed does not employ the features of the present invention listed hereinbelow, hence, a design that would not be able to meet the same level of performance as of the present invention. In particular, Chen et al. teach a common and low frequency path that is implemented in a circular waveguide. Furthermore. Chen et al. high frequency reject filter is a periodic structure that can perform well in terms of providing frequency isolation but it compromises the return loss of the OMJ-filter cascade. Moreover, Chen et al. show relatively long stepped waveguide section implemented in the four high frequency paths.

Accordingly, there is a need for an improved orthomode junction feed assembly with associated filters.

SUMMARY OF THE INVENTION

It is therefore a general object of the present invention to provide an improved orthomode junction feed assembly with associated filters.

An advantage of the present invention is that in the advanced reverse orthomode junction feed assembly with associated filters includes a reversed orthomode junction (as described hereinabove) being a 6-port junction in squared (preferred) or circular waveguide with an asymmetric high frequency band reject filter, a wide-band impedance matching resonant cavity (or cavities), a high-pass filter in the Rx path that rejects the low frequency signal, two (2) magic tees in the Rx path and choking irises in the common path.

Another advantage of the present invention is that in the advanced reverse orthomode junction feed assembly, the asymmetric high frequency band reject filter is fully asymmetric, in both the longitudinal on-axis (z-axis) and the cross-axis (x-axis and y-axis, or radial axis), in order to reject high frequency signal, to provide good pass-band at low frequency (low insertion loss, etc.), and to provide good matching characteristics (good return loss at high frequency).

A further advantage of the present invention is that in the advanced reverse orthomode junction feed assembly, the wide-band impedance matching resonant cavity (or multi-cavities) is a highly effective and compact means of impedance matching the high frequency path to the OMJ, and the choking irises in the common path further improve the return loss of the overall feed.

Yet another advantage of the present invention is that the advanced reverse orthomode junction feed assembly, relative to the axi-symmetric waveguides of the antenna components along the main axis of the junction, circular higher non-symmetric mode cut-off frequency is 1.306 times of the fundamental mode cut-off versus 1.414 times for the square waveguide, and higher symmetric mode cut-off frequency for the circular waveguide is 2.081 versus 2.236 for the square waveguide, such that the preferred square waveguide implementation offers a wider bandwidth operation.

According to an aspect of the present invention there is provided an advanced reverse orthomode junction feed assembly with associated filters for use in an antenna feed system for transmitting and/or receiving a first electromagnetic signal at a first frequency range and receiving and/or transmitting a second electromagnetic signal at a second frequency range for providing a high RF performance of the antenna feed system in a spacecraft vacuum environment, said junction feed assembly comprising:

an orthomode junction including an antenna port for connecting to an antenna and defining a main junction axis, an opposed first signal port generally coaxial with the junction axis to transmit said first signal, and a second signal port generally perpendicular to the junction axis to receive said second signal, said second signal port being located between said antenna port and said first signal port and including four outer ports orthogonal to each other;

a first signal channel operating at the first frequency range and having an on-axis second signal reject filter connecting to the first signal port, the on-axis second signal reject filter including a plurality of filter sections with at least one said filter section being a stub, each said filter section having a respective on-axis length dimension along said main junction axis and a respective cross-axis length dimension perpendicular to the main junction axis, said on-axis and cross-axis length dimensions of each said filter section being different than respective length dimensions of all other of said filter sections; and a second signal channel operating at the second frequency range higher that the first frequency range and having cross-axis first signal reject filters connecting to said second signal port, wherein said first and second signal channels respectively operating with said first and second signals being dual polarization signals.

Conveniently, the plurality of filter sections includes one less stub sections than non-stub sections.

Preferably, the orthomode junction, the on-axis second signal reject filter are of a square waveguide topology.

Typically, each said cross-axis first signal reject filter connects to said second signal port via a respective wide-band impedance matching section, preferably including at least one resonant cavity of said first signal.

In one embodiment, the orthomode feed assembly further includes a choking iris section connecting to said antenna port, and typically including at least one choking iris.

In one embodiment, the orthomode feed assembly further includes a signal combiner operatively connecting to the second signal port of the second signal via the cross-axis first signal reject filters, said signal combiner providing tracking capability to the antenna feed system.

Typically, the signal combiner is a magic tee having an isolated port connecting to a tracking receiver so as to provide the tracking capability.

Typically, each polarization of said second signal being received via a respective pair of said outer ports, each said pair of outer ports including respective diametrically opposed ones of said outer ports.

Other objects and advantages of the present invention will become apparent from a careful reading of the detailed description provided herein, with appropriate reference to the accompanying drawings.

BRIEF DESCRIPTION OF THE DRAWINGS

Further aspects and advantages of the present invention will become better understood with reference to the description in association with the following Figures, in which similar references used in different Figures denote similar components, wherein.

DETAILED DESCRIPTION OF THE PREFERRED EMBODIMENTS

With reference to the annexed drawings the preferred embodiment of the present invention will be herein described for indicative purpose and by no means as of limitation.

Figure 1:
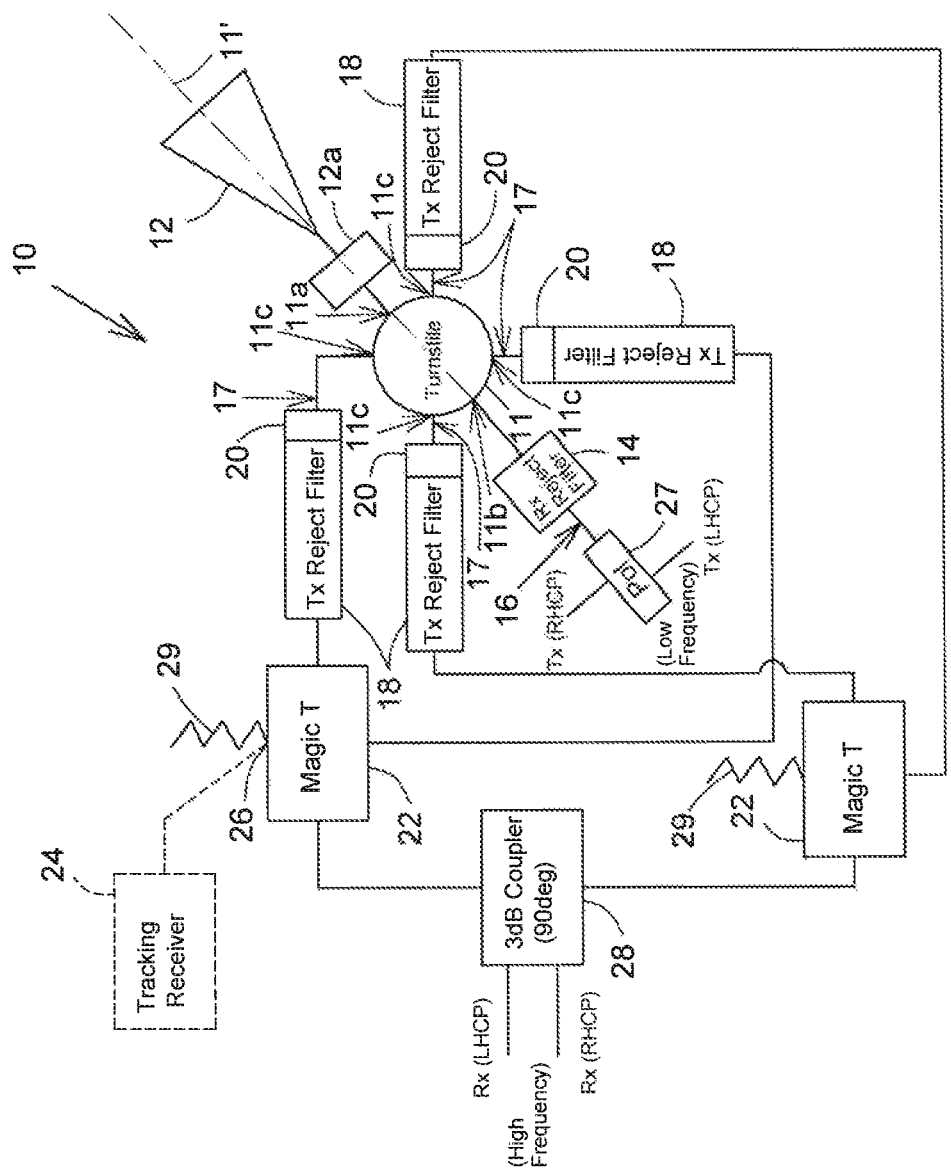
FIG. 1 is a schematic diagram of an antenna feed system based on an advanced reverse orthomode junction feed assembly with associated filters for dual polarization antenna feed system based on reversed orthomode junction topology in accordance with an embodiment of the present invention, for dual (left hand (LH) and right hand (RH)) circular polarization (CP) transmit (Tx) low frequency range signal and receive (Rx) high frequency range signal, relative to one another (when referring to the frequency characteristic)

Referring to FIG. 1, there is shown a schematic diagram of an antenna feed system based on an advanced reverse orthomode junction feed assembly. The embodiment 10 of the 'reverse' orthomode junction feed assembly with associated filters thereof, in accordance with the present invention and as shown in FIGS. 2 and 3, located in the feed chain of an antenna represented by a feed horn 12 (FIG. 1) or the like connected at an antenna common output port 11a of an orthomode junction 11 (or also called turnstile junction) and defining a main junction axis 11' (or z-axis).

A typical nomenclature of an antenna feed system well known in the art is shown in FIG. 1, in which 'RHCP' and 'LHCP' stand for right and left hand circular polarization, '3 dB Coupler' refers to a 3-decibel signal coupler, 'Magic T' refers to a magic tee signal combiner, 'Pol' refers to a signal septum polarizer, 'Turnstile' refers to common RF antenna components such as an RF junction having the appearance of a 'turnstile', 'Rx Reject Filter' and 'Tx Reject Filter' refer to a filter for rejecting the receive (Rx) and the transmit (Tx) frequency signal, respectively, low Frequency' and 'High Frequency' refer to two frequency ranges of signals relative to one another, a low frequency signal relative to another higher frequency signal (High Frequency), and 'Rx' and 'Tx' refer to a receive and a transmit signal, respectively.

Figure 2:
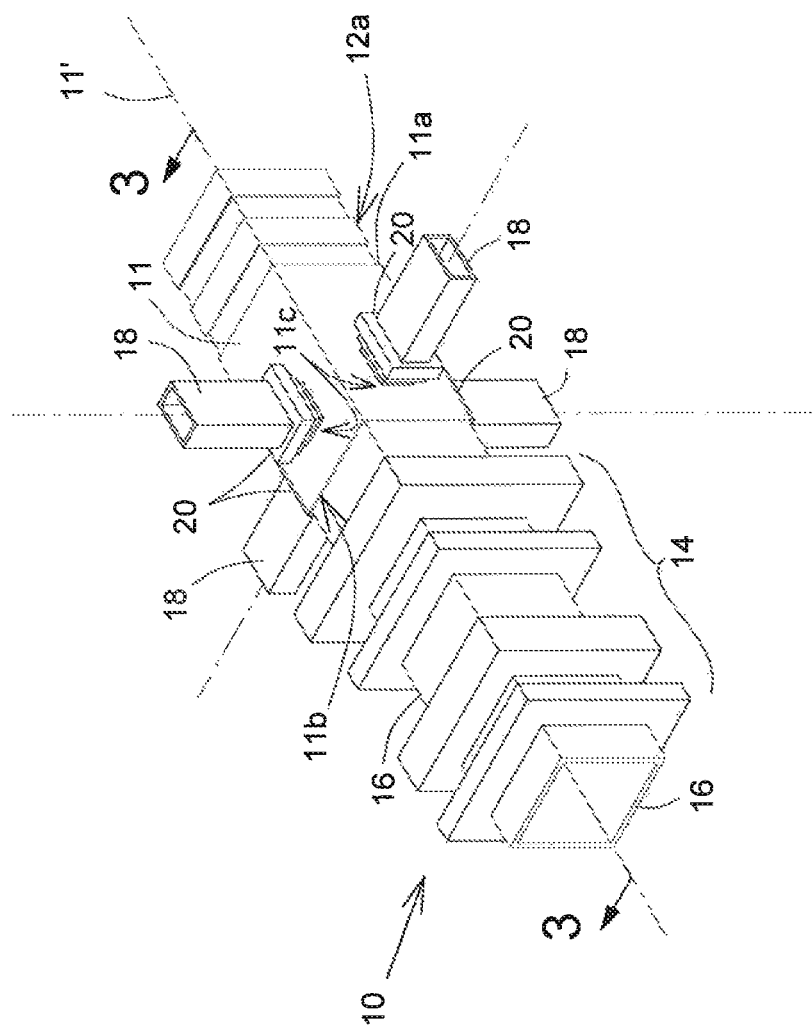
FIG. 2 is a perspective view of the main components of the advanced reverse orthomode junction feed assembly of the embodiment of FIG. 1 with associated filters and for square waveguide topology.
Figure 3:
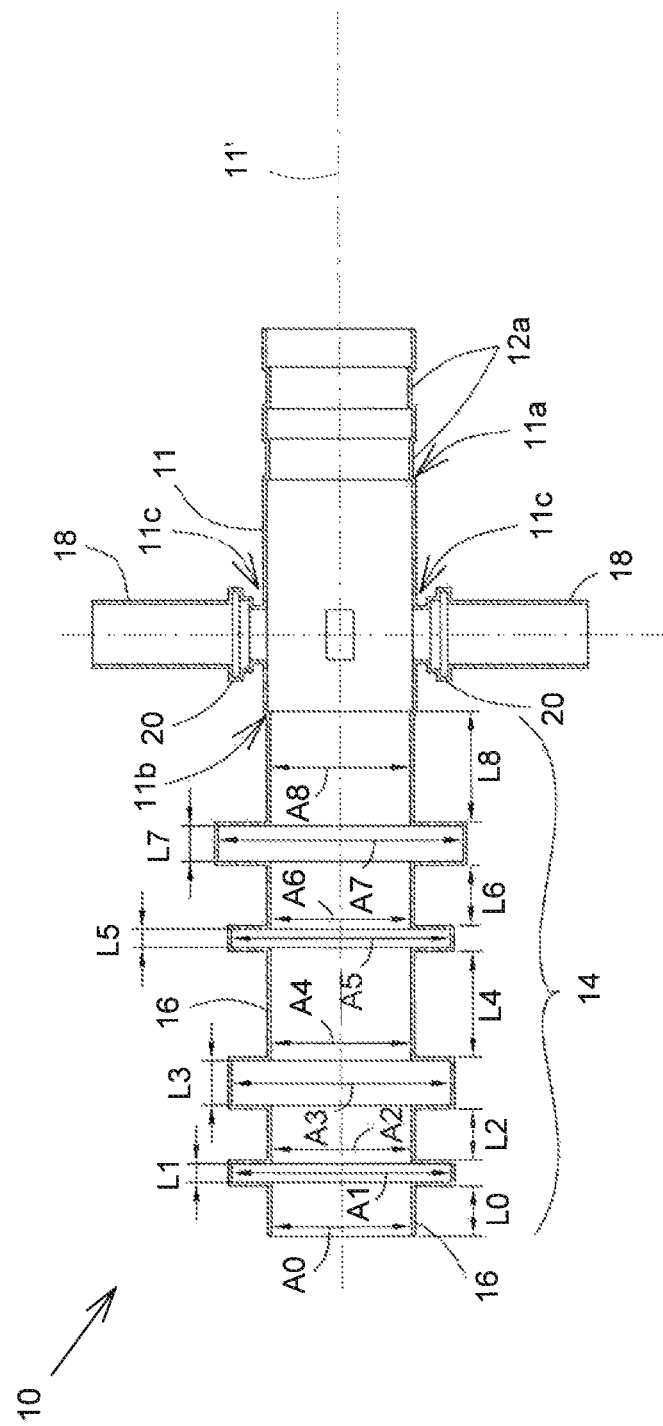
FIG. 3 is a cross-section view taken along an orthogonal plane including line 3-3 of FIG. 1, showing internal details of the main components of the embodiment of FIG. 2.

Relative to the axi-symmetric waveguides of the antenna components along the main axis 11', since circular higher non-symmetric mode cut-off frequency is 1.306 times of the fundamental mode cut-off versus 1.414 times for the square waveguide, and higher symmetric mode cut-off frequency for the circular waveguide is 2.081 versus 2.236 for the square waveguide, wider bandwidth operation can be achieved by selecting the preferred square waveguide implementation, as shown in FIGS. 2 and 3.

The key component of the design of the embodiment 10 of the present invention is an on-axis receive (Rx) reject filter 14 included in the low frequency (LF), preferably transmit (Tx), channel 16 connected to a first signal port 11b of the junction 11, generally opposed and coaxial to the common antenna port 11a, to transmit a first high RF power electromagnetic signal. This filter 14 features such type of symmetry that allows propagating either circular (CP) or dual linear polarization signals.

Figure 4E:
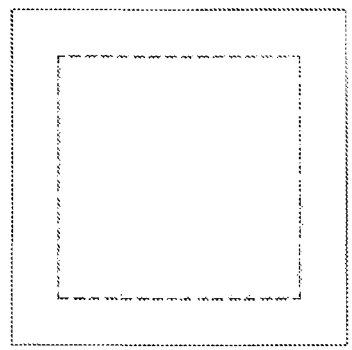
FIGS. 4a to 4j are cross-sectional views of different axisymmetric waveguide filters suitable for use in association with reversed orthomode junction assembly embodiments of the present invention.
Figure 4J:
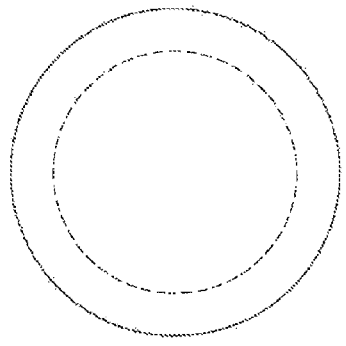
Figure 4D:
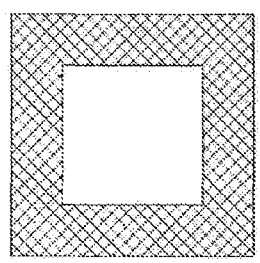
Figure 4I:
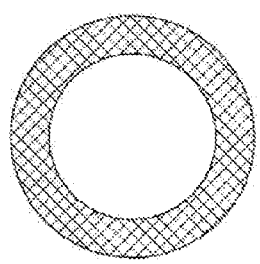
Figure 4C:
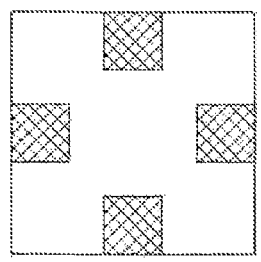
Figure 4H:
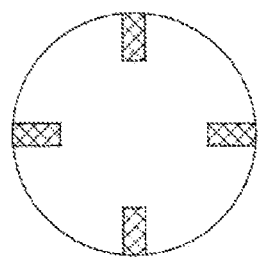
Figure 4B:
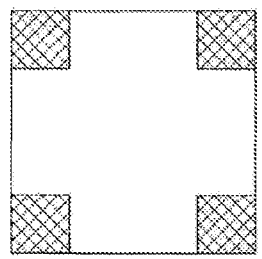
Figure 4G:
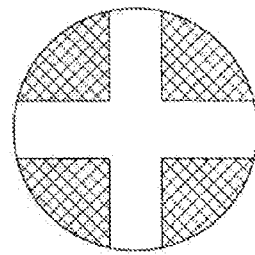
Figure 4A:
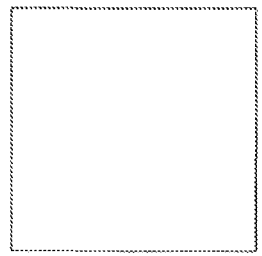
Figure 4F:
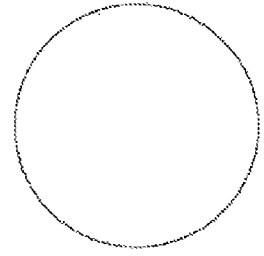

In the present invention, at least one of the filters 14 is preferably either square or radial stub (extending outwardly away from the main axis relative to the respective waveguide and being continuous along the cross-sectional perimeter direction of the waveguide) (as represented in FIGS. 2 and 3 and shown in FIGS. 4e and 4j, respectively, where in FIGS. 4e and 4j the dotted lines represent the respective cross-section of the square waveguide (also shown in FIG. 4a) or the circular waveguide (also shown in FIG. 4f), respectively, along the main axis 11')). Some filter 14 could also be quad-cross iris (as shown in FIGS. 4b and 4g)/quad-ridge designs (as shown in FIGS. 4c and 4h). The square or radial stubs filters 14 have superior power handling and extended band rejection characteristics allowing for practical designs in current Ka-band (between about 18 GHz and 30 GHz), Ku-band (between about 10 GHz and 18 GHz), C-band (between about 3.4 GHz and 6.8 GHz) or any other micro-wave or millimeter-wave signal frequencies applications.

More specifically, as shown in FIG. 3, the respective dimensions, namely on-axis or axial length (along the main axis 11') L0, L1, L2, L3, L4, L5, L6, L7, L8, and cross-axis length (side length for square waveguides or diameter for circular waveguides) A0, A1, A2, A3, A4, A5, A6, A7, A8, of each section of the on-axis Rx reject filter 14 are different from one another such that the filter 14 is fully asymmetric, i.e. in the main axis 11' and in both perpendicular x-axis and y-axis (or radial axis for circular waveguides), but may include a repetitive pattern (not shown). Each filter section refer to each one of the stub section (relative to lengths L1, L3, L5, L7), along with each inter-stub section between two adjacent stubs (relative to lengths L2, L4, L6) and input and output sections (relative to lengths L0, L8) before the first stub section (L1) and after the last stub section (L7), respectively. The number of stub sections could be one-less than (as shown in the figures), equal to or one more than the number of non-stub sections (including inter-stub, input and output sections).

On the other hand, the quad iris/ridge filter (FIGS. 4b, 4c, 4g and 4h) design is more complex, yields lower power handling but its rejection bandwidth is potentially larger (up to 2 times of its center passband frequency).

In order to improve the RF signal return loss of the overall antenna junction feed assembly 10, a choking iris section 12a is located between the common port 11a and the feed horn 12. The choking iris section 12a typically includes at least two (2) choking irises.

Now returning to FIGS. 2 and 3, there are four (4) Tx band reject filters 18 of the high frequency (HF), preferably receive (Rx), channel 17 (FIG. 2) are connected to the ports 11c of the junction 11 that are substantially orthogonal to each other. The four outer ports 11c form the cross-axis second signal port of the orthomode junction 11 that is generally perpendicular to the junction main axis 11' receiving the second electromagnetic signal. In space segment applications, typically, the frequency range of the first Tx signal is lower than the frequency range of the second Rx signal. The first signal (Tx) reject filters 18 are typically highpass filters, using evanescent waveguides or the like.

Furthermore, in order to improve the return loss of the junction assembly 10, a matching section 20 is located between each Tx reject filter 18 and the respective outer port 11c. Typically, each matching section 20 is a wide-band impedance matching resonant cavity (or cavities), with typically at least two (2) cavities, and preferably three (3), as shown in FIGS. 2 and 3.

As shown in FIG. 1, the transmit (Tx) signal is the 'low frequency' signal propagating through the transmit left-hand circular polarization 'Tx(LHCP)' port and the transmit right-hand circular polarization 'Tx(RHCP)' port, while the receive (Rx) signal is the 'high frequency signal' propagating through the receive right-hand circular polarization 'Rx(RHCP)' port and the receive left-hand circular polarization 'Rx(LHCP)' port.

Preferably, as shown in FIG. 1, the second signal outer ports (Rx) 11c are connected to a combiner 22, such as a magic tees, simple reactive tees or the like. When magic tees 22 are used, the magic tee provide tracking capability to the antenna feed system. To this effect, a tracking receiver 24 (shown in dotted lines in FIG. 1) is generally connected to, or interfaces with the isolated port 26 of the magic tee 22, instead of using an RF load 29 (as a waveguide termination absorber of RF signals or the like) thereat.

Although FIG. 1 shows circular polarization feed, as already mentioned, the present invention is obviously also applicable to linear polarization feed (not shown) in which the polarizer 27 (such as a septum polarizer or the like) is replaced by an orthomode transducer (OMT) (not shown), and for which, in the high frequency section (second signal four output ports), the 90 degree coupler 28 is simply removed.

Although the present invention has been described with a certain degree of particularity, it is to be understood that the disclosure has been made by way of example only and that the present invention is not limited to the features of the embodiments described and illustrated herein, but includes all variations and modifications within the scope and spirit of the invention as hereinafter claimed.

I claim:

1. An advanced reverse orthomode junction feed assembly with associated filters for use in an antenna feed system for transmitting and/or receiving a first electromagnetic signal at a first frequency range and receiving and/or transmitting a second electromagnetic signal at a second frequency range for providing a high RF performance of the antenna feed system in a spacecraft vacuum environment, said junction feed assembly comprising:

an orthomode junction including an antenna port for connecting to an antenna and defining a main junction axis, an opposed first signal port generally coaxial with the junction axis to transmit said first signal, and a second signal port generally perpendicular to the main junction axis to receive said second signal, said second signal port being located between said antenna port and said first signal port and including four outer ports orthogonal to each other;

a first signal channel operating at the first frequency range and having an on-axis second signal reject filter connecting to the first signal port, the on-axis second signal reject filter including a plurality of filter sections with at least one said filter section being a stub, each said filter section having a respective on-axis length dimension along said main junction axis and a respective cross-axis length dimension perpendicular to the main junction axis, said on-axis and cross-axis length dimensions of each said filter section being different than respective length dimensions of all other of said filter sections; and a second signal channel operating at the second frequency range higher that the first frequency range and having cross-axis first signal reject filters connecting to said second signal port, wherein said first and second signal channels respectively operating with said first and second signals being dual polarization signals.

2. The junction feed assembly of claim 1, wherein the plurality of filter sections includes one less stub sections than non-stub sections.

3. The junction feed assembly of claim 1, wherein the orthomode junction, the on-axis second signal reject filter are of a square waveguide topology.

4. The junction feed assembly of claim 1, wherein each said cross-axis first signal reject filter connects to said second signal port via a respective wide-band impedance matching section.

5. The junction feed assembly of claim 4, wherein said wide-band impedance matching section includes at least one resonant cavity of said first signal.

6. The junction feed assembly of claim 1, further including a choking iris section connecting to said antenna port.

7. The junction feed assembly of claim 6, wherein said choking iris section includes at least one choking iris.

8. The junction feed assembly of claim 1, further including a signal combiner operatively connecting to the second signal port of the second signal via the cross-axis first signal reject filters, said signal combiner providing tracking capability to the antenna feed system.

9. The junction feed assembly of claim 8, wherein said signal combiner is a magic tee having an isolated port connecting to a tracking receiver so as to provide the tracking capability.

10. The junction feed assembly of claim 1, wherein each polarization of said second signal being received via a respective pair of said outer ports, each said pair of outer ports including respective diametrically opposed ones of said outer ports.

\* \* \* \* \*